United States Patent [19]

Barman et al.

[11] 4,264,898

[45] Apr. 28, 1981

[54] ANALOG TO DIGITAL CONVERTER FOR ELECTRONIC ENGINE CONTROL SYSTEMS

[75] Inventors: Alan W. Barman, Oak Park; Thomas W. Hartford, Livonia, both of Mich.

[73] Assignee: The Bendix Corporation, Southfield, Mich.

[21] Appl. No.: 881,982

[22] Filed: Feb. 27, 1978

[51] Int. Cl.[3] .................... H03K 13/20; G06F 11/30; F02B 77/08

[52] U.S. Cl. .................... 340/347 NT; 123/198 DB; 340/347 AD; 364/431; 371/14; 371/20

[58] Field of Search .................... 364/424, 431, 442; 123/32 EA, 32 EC, 32 EL, 32 EK, 119 R, 198 DB; 340/347 AD, 347 CC, 347 NT

[56] References Cited

U.S. PATENT DOCUMENTS

| | | | |
|---|---|---|---|
| 3,541,315 | 11/1970 | Naydan et al. | 340/347 AD |
| 3,581,304 | 5/1971 | Paradise | 340/347 AD |
| 3,688,221 | 8/1972 | Fruhalf | 340/347 AD |
| 3,750,142 | 7/1973 | Barnes et al. | 340/347 CC |
| 3,858,561 | 1/1975 | Aono | 123/119 R |
| 3,893,432 | 7/1975 | Krupp et al. | 123/32 EA |
| 3,961,325 | 6/1976 | Kendall et al. | 340/347 CC |
| 4,094,274 | 6/1978 | Harada et al. | 123/32 EL |
| 4,099,495 | 7/1978 | Kiencke et al. | 123/32 EG |
| 4,119,070 | 10/1978 | Asano | 123/32 EC |
| 4,150,654 | 4/1979 | Heitzman et al. | 123/198 DB |

*Primary Examiner*—Felix D. Gruber

*Attorney, Agent, or Firm*—Gaylord P. Haas, Jr.; Russel C. Wells

[57] ABSTRACT

A method and apparatus for controlling the various functions of an internal combustion engine using a program-controlled microprocessor having a memory preprogrammed with various control laws and associated control schedules receives information concerning one or more engine operating parameters such as manifold absolute pressure, throttle position, engine coolant temperature, air temperature, and engine speed or period and the like. These parameters are measured and then supplied to input circuits for signal conditioning and conversion to digital words usable by the microprocessor. The microprocessor system computes a command word indicative of a computer-commanded engine control operation and output circuitry responds to predetermined computer-generated commands and to the computed digital command words for converting them to corresponding pulse-width control signals for controlling such engine operations as fuel-injection, ignition timing, proportional and/or on-off EGR control, and the like.

9 Claims, 4 Drawing Figures

*Microprocessor-Based Electronic Engine Control System*

Microprocessor-Based Electronic Engine Control System

Ramp Generator

Timing Diagram

ANALOG TO DIGITAL CONVERTER FOR ELECTRONIC ENGINE CONTROL SYSTEMS

BACKGROUND OF THE INVENTION

1. Field of the Invention

This invention relates generally to a method and apparatus for controlling an internal combustion engine, and more particularly to a microprocessor-based electronic engine control system having a memory preprogrammed with various control laws and control schedules responsive to one or more sensed engine-operating parameters for generating signals for controlling fuel injection, ignition timing, EGR control, or the like.

2. Statement of the Prior Art

Many of the patents of the prior art recognize the need for employing the enhanced accuracy of digital control systems for more accurately controlling one or more functions of an internal combustion engine.

U.S. Pat. No. 3,969,614 which issued to David F. Moyer, et al on July 13, 1976 is typical of such systems as are U.S. Pat. No. 3,835,819 which issued to Robert L. Anderson, Jr. on Sept. 17, 1974; U.S. Pat. No. 3,904,856 which issued to Louis Monptit on Sept. 9, 1975; and U.S. Pat. No. 3,906,207 which issued to Jean-Pierre Rivere, et al on Sept. 16, 1975. All of these Patents represent a break-away from the purely analog control systems of the past, but neither the accuracy, reliability, or number of functions controlled is sufficient to meet present day requirements.

Future internal combustion engines will require that emissions be tightly controlled due to ever-increasing governmental regulations, while fuel consumption is minimized and drivability improved over the entire operating range of the engine. None of the systems of the prior art provide a method and apparatus for controlling the operation of an internal combustion engine over its entire operating range with sufficient accuracy to attain minimal emissions and minimal fuel comsumption simultaneously with improved drivability.

The systems of the prior art attempt to control one or more engine-operating functions but none attempts to control the operation of the fuel pump, fuel injection, engine ignition timing, on-off and/or proportional EGR control, or the like while using feedback from such devices as oxygen sensors for emission control purposes or for effecting a closed-loop fuel control made of operation, while yet including provisions for optimizing acceleration enrichment, handling, and the like. Moreover, the systems of the prior art are extremely expensive, bulky, difficult to repair and maintain and are, therefore, not commercially feasible at the present time.

These and other problems of the prior art are solved by the microprocessor-based electronic engine control system of the present invention which eliminates most or all of the problems of the prior art, and enables a commercially feasible implementation of a compact digital control system having a relatively low cost, and which is easy to repair and maintain. The system of the present invention is able to implement much more advanced and complex fuel control laws and expand the various control functions performed thereby to include ignition timing and on-off and/or proportional EGR control while, at the same time, reducing the cost and size of the unit and increasing reliability so as to render the system commercially feasible.

Another problem existing in the prior art is that electronically-controlled fuel systems are subject to failure, and a failure could conceivably occur in which a fuel injection pulse were left on so that fuel could continue to be injected or supplied to the engine even after some catastrophic failure. The present invention also supplies means for automatic fuel shut-off upon the detection of a failure in the system so as to prevent fires, etc.

SUMMARY OF THE INVENTION

The switchable range analog-to-digital converter of the present invention represents an improvement over the analog-to-digital conversion system employing the window counter of the preferred embodiment of the present invention and extends the range thereof by adding multiple count detects to the output of the window counter. The window counter must contain enough bits to count the entire window time for an "m" bit (for example a ten bit) converter but means are provided which hold a data bit from the microprocessor to indicate the selection of an "n" bit (for example, an eight bit converter) or a ten bit converter so that either an eight bit or a ten bit conversion may be programmably selected. Means responsive to the selection data bit employ the multiple count detects at the outputs of the window counter for detecting the counts corresponding to the beginning and end of the feedback control signal for both eight and ten bit conversions.

The fuel shut-off circuit for the electronic engine control system of the present invention includes means for detecting one or more of a plurality of failures such as termination of the operation of the system clock, an engine stall condition, or the like and generate a fail detect signal in response thereto. Getting means responsive to said fail detect circuit terminates the transmission of the normally-generated fuel control pulses to said means for supplying fuel to said engine to protect the driver, the passengers, and the vehicle from fire, explosion, and the like. Additionally, means may be added directly responsive to the generation of said fail detect signal for turning off the fuel pump itself. In this manner, both the fuel pump controls and the fuel injector controls must fail at the same time to defeat the dual protective features provided by the present invention.

This application is one of fourteen applications filed on Feb. 27, 1978, all commonly assigned and having substantially the same specification and drawings, the fourteen applications being identified below:

| Serial Number | Title |
|---|---|
| 881,321 | Microprocessor-Based Electronic Engine Control System |
| 881,322 | Feedback-Compensated Ramp-Type Analog to Digital Converter |
| 881,323 | Input/Output Electronic For Microprocessor-Based Engine Control System |
| 881,324 | Switching Control of Solenoid Current in Fuel Injection Systems |
| 881,921 | Dual Voltage Regulator With Low Voltage Shutdown |
| 881,922 | Oxygen Sensor Qualifier |
| 881,923 | Ratiometric Self-Correcting Single Ramp Analog To Pulse Width Modulator |
| 881,924 | Microprocessor-Based Engine Control System Acceleration Enrichment Control |
| 881,925 | Improvements in Microprocessor-Based Engine Control Systems |
| 881,981 | Oxygen Sensor Feedback Loop Digital Electronic Signal Integrator for Internal Combustion Engine Control |
| 881,982 | Improvements in Electronic Engine Controls System |
| 881,983 | Electronic Fuel Injection Compensation |
| 881,984 | Ignition Limp Home Circuit For Electronic Engine |

-continued

| Serial Number | Title |
|---|---|
| | Control Systems |
| 881,985 | Oxygen Sensor Signal Conditioner |

Application Ser. No. 881,321, now U.S. Pat. No. 4,255,789 has been printed in its entirety and the specification of that application is specifically incorporated herein by reference.

BRIEF DESCRIPTION OF THE DRAWINGS

FIG. 5A is a block diagram of the reset control circuitry.

Figure 2:
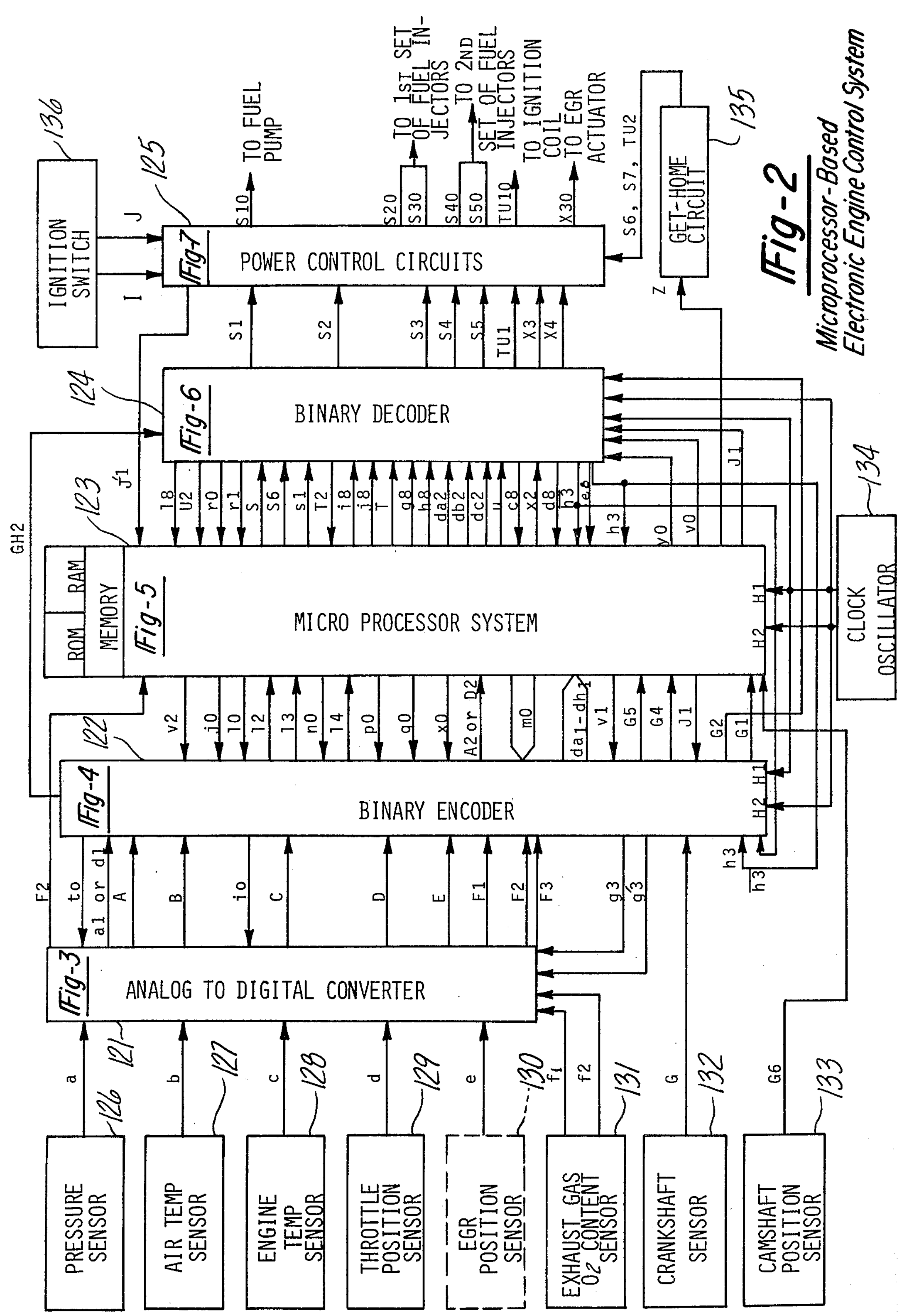
FIG. 2 is a block diagram of the microprocessor-based electronic engine control system.
Figure 3F:
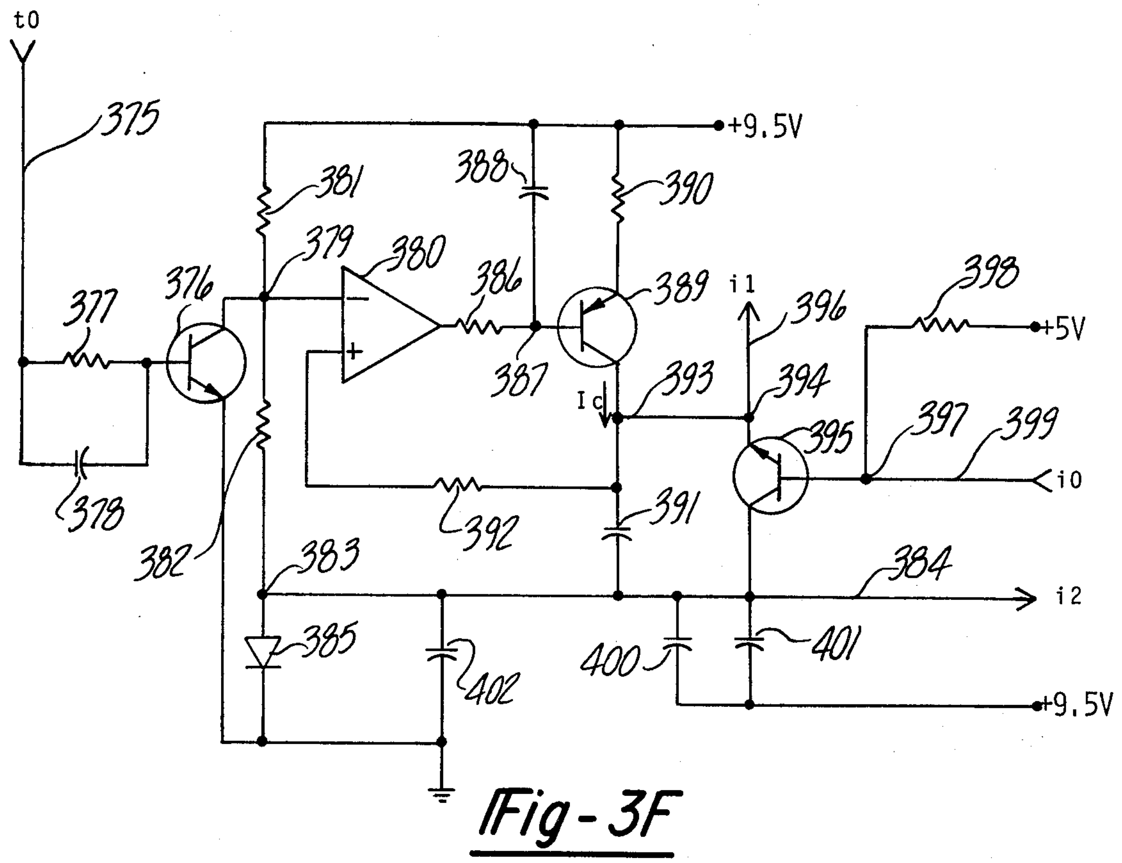
FIG. 3F is an electrical schematic diagram of the preferred embodiment of the ramp generator circuitry.
Figure 3G:
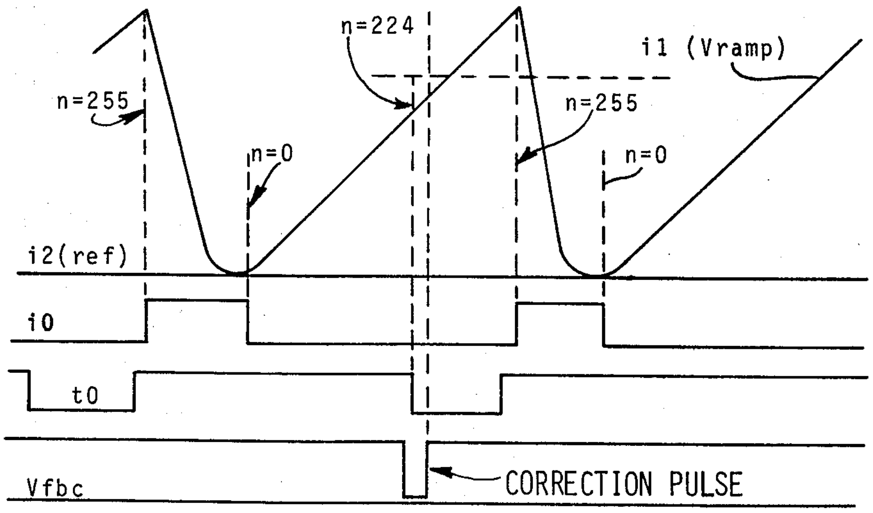
FIG. 3G is a timing diagram for explaining the operation of the ramp generator circuitry.

We claim:

1. In an internal combustion engine having an intake system, an exhaust system, an engine block, a plurality of cylinders disposed in said engine block, a piston mounted for reciprocal movement within each of said plurality of cylinders, means responsive to the generation of one or more control signals for controlling the supply of fuel to a selected one or more of said plurality of cylinders of said engine and the ignition thereof, the improvement comprising:

a microprocessor including memory means for storing a program for implementing one or more control laws, said microprocessor being responsive to one or more engine-operating parameters for implementing said control laws and computing one or more of said control signals;

means for sensing one or more of said engine-operating parameters and generating corresponding analog signals indicative of the measured value thereof;

analog-to-digital converter means for converting a selected one of said analog signals into a corresponding binary data word indicative thereof, said microprocessor system being responsive to one or more of said binary data words for implementing said control laws and computing said control signals;

said analog-to-digital converter means including a ramp-type analog to digital converter and a binary counter for operating said binary counter so long as a generated ramp signal does not exceed the value of said analog signal, window means for enabling said counter to continue counting even if said analog input signal momentarily drops below the value of said generated ramp voltage due to noise or the like, said window counter including multiple count detects associated with the output thereof, and means for storing a microprocessor-generated data bit for selecting either an "n" bit or a "m" bit conversion, where "m" is greater than "n", thereby extending the range of said converter and enabling it to perform both "n" and "m" bit conversions depending on the conversion time.

2. In an A/D conversion system wherein an analog input signal is compared with a ramp signal to produce a pulse-width signal indicative of the value of said analog input signal and wherein a binary counter counts clock pulses during the duration of said pulse-width signal to produce a digital count indicative of the value of said analog input signal an improved ramp signal generating system comprising current source means, a ramp capacitor coupled between said current source means and ground, said ramp capacitor means being responsive to charging current from said current source means for generating a ramp signal, reset means for initially discharging said ramp capacitor and establishing a predetermined initial reference voltage thereon from which to begin the generation of said ramp signal and hence a subsequent conversion operation, counter means, decoder means coupled to the output of said counter means and responsive to one or more predetermined counts attained therein for generating a corresponding one or more count decode signals indicative of said attained predetermined counts, said reset means being responsive to one of said count decode signals for initiating the discharging of said ramp capacitor and the beginning of said conversion operation, a feedback comparator having first and second inputs and a comparator output, said first comparator input being operatively coupled to said ramp capacitor to receive said generated ramp signal, means operatively coupled to said second input of said feedback comparator for establishing a reference voltage indicative of the desired voltage level said generated ramp signal should have reached at the time of attainment of another predetermined one of said counts, the output of said feedback comparator generating a pulse-width signal which begins with the generation of said ramp voltage and ends when said ramp voltage becomes equal to said reference voltage level such that the pulse-width duration of said feedback comparator output signal is proportional to the error in the rate of generation of said ramp signal, logical gating means operatively coupled to the output of said feedback comparator and responsive to another one of said count decode signals indicative of the attainment of said another predetermined one of said counts and to the output of said feedback comparator for generating a feedback correction signal indicative of ramp rate error, the improvement comprising:

means for generating one of at least a first conversion command signal requesting an "m" bit conversion and a second conversion command signal requesting an "n" bit conversion where m is greater than n and where the number of bits to be converted depends on the conversion time available and determines the accuracy of the conversion process, and multiple decoding means associated with said decoder means and responsive to said one of at least first and second conversion command signals for selectively controlling the number of bit positions utilized in said binary counter for said pulse-width-to-binary conversion thereby selectively extending the range of values over which said A/D converter may be used while optimizing the accuracy of the resulting conversions.

3. The improved A/D converter system of claim 2 further including window counting means for defining a predetermined noise immunity count duration window during which said pulse-width-to-binary counter will resume counting even though said counting was temporarily stopped due to transient noise signals causing the value of said generated ramp signal to be erroneously and momentarily greater than the value of said analog input signal being converted and wherein said multiple decoding means is further responsive to said selected first or second conversion command signals for selectively controlling the size of said noise immunity window to insure conversion accuracy and prevent erroneous readings.

4. The improved A/D converter system of claim 3 wherein said window counter means includes a window counter having enough stages to enable said window counter to count the entire period of said count duration window for said "m" bit conversion when all "m" bit positions of said pulse-width-to-binary counter are utilized for optimal conversion accuracy.

5. The improved A/D converter system of claim 3 further including computer means, memory means associated with said computer means, program means stored within said memory means for implementing various computational functions, control laws, and the like, said computer means executing said program means for calculating which of said first and second conversion command signals are to be generated, and means for temporarily storing one of said first and second converter command signals for controllably selecting the use of all "m" bit positions in said pulse-width-to-binary counter of said converter when the time available for the conversion is relatively long for optimal conversion accuracy or only "n" bit positions of said pulse-width-to-binary counter of said converter when the time available for conversion is relatively short for optimal conversion accuracy.

6. In an A/D converter system wherein an analog input signal is compared with a generated ramp voltage signal to produce a pulse-width signal indicative of the value of said analog input signal and wherein a pulse-width-to-binary counter having "m" bit positions counts clock pulses during the duration of said pulse-width signal to accumulate a binary count indicative of the value of said analog input signal within said counter upon the termination of said pulse-width signal, current source means, a ramp capacitor coupled between said current source means and ground, said ramp capacitor means being responsive to charging current from said current source for accumulating a charge to generate a ramp voltage signal, reset means for initially discharging said ramp capacitor, and establishing a predetermined initial reference voltage thereon from which all conversions begin, second counter means, decoder means coupled to the output of said second counter means for detecting one or more predetermined counts attained therein and generating a corresponding one or more count decode signals in response thereto, said reset means being responsive to one of said count decode signals for initiating said conversion process, a feedback comparator having first and second inputs and a feedback comparator output, said first input of said feedback comparator being operatively coupled to said ramp capacitor for receiving said generated ramp voltage signal, means operatively coupled to said second input of said feedback comparator for generating a reference voltage indicative of the desired voltage level which said ramp voltage signal should have reached at the time of attainment of another predetermined one of the counts attained in said second counter means, the output of said feedback comparator generating a pulse-width signal beginning with the initial charging of said ramp capacitor and ending when the value of said ramp voltage signal is equal to the value of said established reference voltage, logical gating means operatively coupled to the output of said feedback comparator and responsive to another one of said predetermined count decode signals indicative of the attainment of said another predetermined one of said counts attained in said second counter means for generating a feedback correction signal indicative of ramp rate error, means responsive to said signal indicative of ramp rate error for selectively controlling the operation of said current source means to charge said ramp capacitor and therefore selectively varying the rate of generation of said ramp voltage signal for correcting same, a computer-based control system including computer means, memory means, and program means stored within said memory means for implementing one or more control laws and various computational sequences, the improvement comprising:

said computer means executing said program means for generating a first conversion command signal requesting an "m" bit conversion and a second conversion command signal requesting an "n" bit conversion where m is greater than n and where the greater the number of bit positions within said pulse-width-to-binary counter, the greater the time required for the conversion;

window counter means for defining a predetermined noise immunity count duration window period during which said pulse-width-to-binary counter resumes counting even though said counting was temporarily stopped due to transient noise signals or the like causing the value of said generated ramp voltage signal to be erroneously greater than the value of said analog input signal being converted;

means for temporarily storing the program-generated one of said first and second conversion command signals; and multiple decoding means responsive to said stored conversion command signal for selecting all "m" bit positions of said pulse-width-to-binary counter and for selectively controlling and maximizing the size of said defined window period for a greater accuracy conversion and for selecting only "n" bits of said pulse-width-to-binary counter and for selectively decreasing the size of said defined window period for increasing the accuracy of said conversion so that the range of values over which said A/D conversion may be used and the accuracy of the resulting conversions may be optimized depending upon the nature of said analog input signal and the conversion time available.

7. In an A/D converter system wherein an analog input signal to be converted into a binary number indicative of the value thereof is generated by comparing the analog input signal against a voltage ramp signal generated at a predetermined rate established by the charging rate of a ramp capacitor to output a pulse-width signal indicative of the value of said analog input signal and a multiple stage pulse-width-to-binary counter is enabled to count clock pulses during the duration of said pulse-width output signal such that the binary number stored in said pulse-width-to-binary counter at the termination of said pulse-width output signal is a highly accurate digital representation of the value of said analog input signal, a closed loop self-correcting feedback method for automatically compensating the rate of generation of said ramp voltage signal for capacitive leakage, variations in circuit parameters with temperature, age, fluctuations and power supply voltage, including the steps of (a) initially discharging said ramp capacitor to begin the generation of said ramp voltage signal at a predetermined initial reference level from which each and every conversion cycle is begun, (b) counting at a fixed rate during the charging of said ramp capacitor, (c) comparing the generated ramp voltage signal with an established reference voltage indicative of a desired value of voltage which said ramp voltage signal should have attained when said counting step indicates that a predetermined particular count has been attained, (d) generating a feedback correction signal indicative of the difference between the time the value of said ramp voltage signal reaches the value of said voltage reference and the time of attainment of said predetermined count, and (e) correcting the charging rate of said ramp capacitor for selectively varying the rate of generation of said ramp voltage signal in response to said feedback correction signal, the improvement comprising the steps of: (f) selecting all of the stages of said pulse-width-to-binary counter for use in said conversion process to achieve optimal conversion accuracy when a relatively long conversion time is available or selecting less than all of the stages of said pulse-width-to-binary counter to achieve optimal conversion accuracy when a relatively shorter conversion time is available.

8. The method of claim 7 further including the steps of counting clock pulses to establish a noise immunity window having a given count duration period to provide noise immunity so that said pulse-width-to-binary counter may automatically resume counting even though said counting was temporarily interrupted due to transient noise signals causing the value of said generated ramp voltage signal to be erroneously greater than the value of said analog input signal being converted, the count duration period of said window normally being greater than the maximum count time of said pulse-width-to-binary counter when all of the stages of said multiple stage binary counter are selected for the conversion process, and selectively increasing or decreasing the count duration period of said window to provide said noise immunity regardless of the number of stages chosen to be used in said pulse-width-to-binary counter.

9. A switchable range analog-to-digital converter system including a ramp-type A/D converter for converting an analog input signal into a binary number indicative of the value thereof, window counter means for defining a predetermined count duration noise immunity window and enabling said binary counter to operate throughout the period defined by said noise immunity window even if transient noise signals make it temporarily appear that the value of the ramp voltage is greater than the value of the analog input signal to temporarily discontinue the operation of the conversion process, and multiple count detection means associated with the output of said window counter for selectively extending the range of said converter system between at least first and second different and distinct multi-bit conversion accuracies, and means for storing a signal for selecting either a first or a second multi-bit converter mode of operation.

* * * * *